Figure 1:
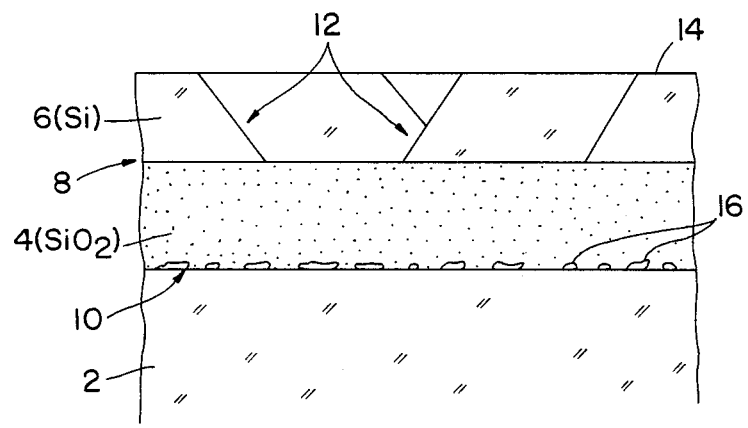

United States Patent [19]

Margail et al.

[11] Patent Number: 4,975,126
[45] Date of Patent: Dec. 4, 1990

[54] PROCESS FOR THE PRODUCTION OF AN INSULATING LAYER EMBEDDED IN A SEMICONDUCTOR SUBSTRATE BY IONIC IMPLANTATION AND SEMICONDUCTOR STRUCTURE COMPRISING SUCH LAYER

[75] Inventors: Jacques Margail, Grenoble, France; John Stoemenos, Salonica, Greece

[73] Assignee: Commissariat a l'Energie Atomique, France

[21] Appl. No.: 207,379

[22] Filed: Jun. 15, 1988

[30] Foreign Application Priority Data

Jun. 15, 1987 [FR] France .................. 87 08272

[51] Int. Cl.$^5$ .......................... H01L 21/265
[52] U.S. Cl. .................. 145/33.2; 437/24; 437/25; 437/26; 437/84; 437/248
[58] Field of Search ........... 437/24, 26, 82, 84, 437/247, 248, 25; 148/33, 33.2, 33.3

[56] References Cited

U.S. PATENT DOCUMENTS 4,676,841 6/1987 Celler .................... 437/24

FOREIGN PATENT DOCUMENTS 56-60556 4/1983 Japan .................... 437/24

OTHER PUBLICATIONS

Electronics Letters, Apr. 1986, vol. 22, No. 9, K. J. Reeson.
Japanese Journal of Applied Physics, vol. 20, No. 12, 1987 (Irita).
Japanese Patent Abstracts, vol. 7, No. 148, Jun. 1983 (Toshio).
IEEE Transactions on Electron Devices, vol. ED-33, Mar. 1986 (Foster).
Solid State Technology, Mar. 1987 (G. K. Celler).
Appl. Phys. Lett., 50(1), Jan. 1987 (Alice et al.).
Bunker et al., "Formation of Silicon-on-Insulator Structures by Multiple Oxygen Implantations", Mat. Res. Soc. Symp. Proc. vol. 93 (Apr. 1987), pp. 125–130.

Primary Examiner—Olik Chaudhuri
Attorney, Agent, or Firm—Hayes, Soloway, Hennessey & Hage

[57] ABSTRACT

A process for the production of an insulator buried in a semiconductor substrate by ionic implantation, and semiconductor structure comprising such layer.

According to the invention the semiconductor structure comprises a silicon dioxide layer (104) interposed between a silicon substrate (102) and a silicon film (106) obtained by successive implantations of oxygen ions in the substrate, with doses less than $1.5 \cdot 10^{18}$ ions/cm$^2$, each implantation being followed by an annealing at a temperature higher than 1100° C. The semi-conductor film (106) has a level of dislocations lower than $10^5$ per cm$^2$, and the oxide layer (104) is completely homogeneous.

12 Claims, 3 Drawing Sheets

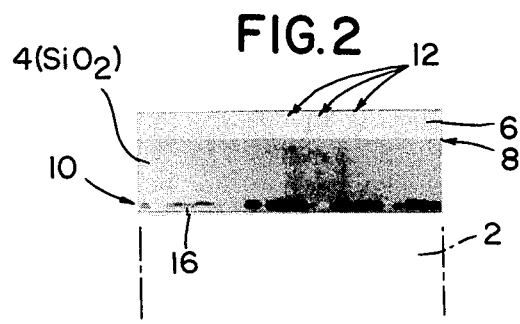
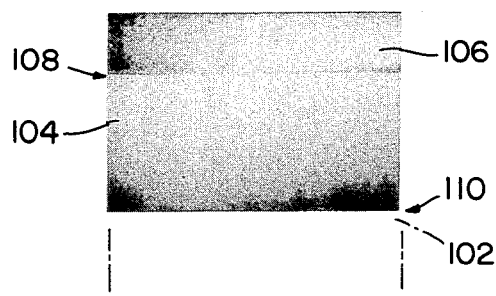

PROCESS FOR THE PRODUCTION OF AN INSULATING LAYER EMBEDDED IN A SEMICONDUCTOR SUBSTRATE BY IONIC IMPLANTATION AND SEMICONDUCTOR STRUCTURE COMPRISING SUCH LAYER

DESCRIPTION

The invention relates to a process for the production of a continuous layer of oxide or nitride buried in a semiconductor substrate, by implantation of oxygen or nitrogen ions in the substrate, and also to semiconductor structures comprising such buried layer of oxide or nitride.

The invention relates more particularly to the production of MIS (metal/insulator/semiconductor) integrated circuits, CMOS (compatible metal/oxide/semiconductor) integrated circuits or bipolar circuits of the silicon-on-insulator type, which operate very quickly and are possibly highly resistant to ionizing radiations and must dissipate high powers. The invention also applies to the field of guided, possibly integrated optics, for the production of flat or stripe-type light guides.

Silicon-on-insulator technology represents a substantial improvement in the field of microelectronics in comparison with the standard techniques in which the active components of the integrated circuits are produced directly on a solid silicon monocrystalline substrate, since the use of an insulating support results in a considerable reduction in the stray capacity as between the source and the substrate on the one hand, and the drain and the substrate on the other, and reduces considerably the active components of the circuits, the result being an increase in the operating speed of such circuits.

Silicon-on-insulator technology also leads to an appreciable simplification of manufacturing processes, an increase in integration density, improved behaviour under high voltages, and low sensitivity to radiations, since the volume of monocrystalline silicon is low.

One of the silicon-on-insulator technologies at present known consists of implanting oxygen $O^+$ ions or nitrogen $N^+$ ions in heavy doses in solid monocrystalline silicon, so as to form, after high temperature annealing of the substrate, a buried insulating layer of silicon dioxide or silicon nitride. This process, known as the SIMOX process (separation by implanted oxygen) has formed the subject of a large number of publications.

In this respect the following may be cited: the article by P. L. F. Hemment "Silicon-on-insulator formed by $O^+$ or $N^+$ ion implantation", published in Mat. Res. Soc. Symp., vol. 53, 1986; the article by J. Stoemenos et al. "New conditions for synthesizing SOI structures by high dose oxygen implantation", published in the Journal of Crystal Growth 73 (1985) 546–550; the article by M. Bruel et al. "High temperature annealing of SIMOX layers", published in E. MRS. Strasbourg, June 1986, pp. 105–119; the article by J. Stoemenos et al., published in Appl. Phys. Lett. 48 (21), 26 May 1986, pp. 1470–1472, entitled "$SiO_2$ buried layer formation by subcritical dose oxygen ion implantation" or the article by G. K. Celler et al. "High quality Si-ON-$SiO_2$ films by large dose oxygen implantation and lamp annealing", published in Appl. Phys. Lett. 48 (8), of 24 Feb. 1986, pp. 532–534.

FIG. 1 shows a semiconductor structure obtained by the SIMOX process in diagrammatical longitudinal section. The structure comprises a solid monocrystalline silicon substrate 2 surmounted by a silicon dioxide layer 4 coated with a monocrystalline silicon film 6.

The $Si/SiO_2$ interface 8 is the monocrystalline film 6, the dioxide layer 4 being referred to as the "front interface", the $Si/SiO_2$ 10 interface between the solid substrate 2 and the dioxide layer 4 being referred to as the "rear interface".

The standard conditions of the SIMOX technology for the formation of an oxide layer are: oxygen implantation doses of 1.6 to $2.5 \cdot 10^{18} O^+/cm^2$ ions, an implantation energy of 200 keV, a substrate heating during implantation to a temperature of between 500° and 700° C., then a high temperature annealing to complete the formation of the buried silica layer at temperatures of between 1150° to 1405° C. More particularly, annealing is performed at 1300° C. for 6 hours (cf. the above articles by Stoemenos and Bruel) or at 1405° C. for 30 minutes, as disclosed in the Celler article.

High temperature annealing induces a segregation of all the implanted oxygen towards the inside of the buried silicon dioxide layer. More particularly, the silicon film 6 surmounting the dioxide layer 4 no longer contains any oxide precipitate, as indicated in Bruel's article.

The widely used SIMOX process has some disadvantages. More particularly, the movement of oxygen or nitrogen ions into the silicon to a varying extent damages the monocrystalline silicon film 6, creating often irreparable defects 12 (FIG. 1). The defects are more particularly traversing dislocations anchored to the $Si/SiO_2$ interface 8, passing through the silicon film 6 and coming out on the surface 14 thereof. Their density varies between $10^6$ and $10^{10}/cm^2$.

FIG. 2, which is a photograph of a semiconductor structure obtained by implanting oxygen ions with a dose of $1.6 \cdot 10^{18}$ ions/$cm^2$ in a silicon substrate heated to 600° C., the substrate then being annealed at 1300° C. for 6 hours, clearly shows the dislocations traversing the monocrystalline silicon film. This photograph is a microscopy by electronic transmission on edge.

These defects or dislocations of the silicon film cause a reduction in the preformances of the electric components subsequently produced in the semiconductor layer 6, and can form, for example, the source of junction leaks, thus producing considerable leakage currents.

In the field of guided optics such dislocations disturb the light vehicled by the buried silica layer, causing light losses.

Moreover, the quality of the buried silicon dioxide layer is not perfect. More particularly, it has silicon islets 16 which are very troublesome, more particularly in microelectronics, since they reduce the voltage behaviour of the dioxide layer 4 and may be priviledged centres of charge trapping. Such silicon islets are clearly shown in FIG. 2.

The presence of silicon islets or precipitates in the oxide layer is particularly troublesome in the case of MIS transistors produced in the semiconductor film 6.

Figure 3:
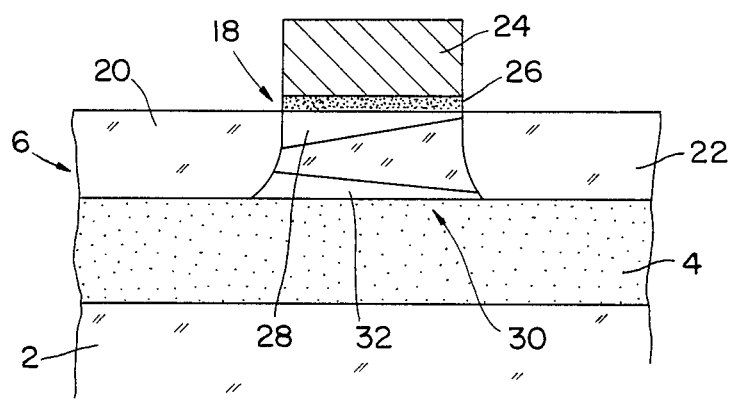

In this respect FIG. 3 shows a front transistor 18 comprising source 20 and a drain 22 respectively defined by implantation of n-type or p-type ions in the monocrystalline film 6, and a grid 24, generally consisting of polycrystalline silicon, surmounting the silicon film 6 and isolated therefrom by the grid oxide 26. The channel 28 of the front transistor 18 is defined beneath the grid oxide 26, between the source and the drain of the transistor.

Associated with the front transistor 18 is a rear transistor 30 whose channel 32 lies between the source 20 and the drain 22; the buried oxide layer 4 plays the role of grid oxide, while the solid silicon substrate 2 plays the role of grid in the rear transistor.

The presence of silicon islets 16 in the buried oxide layer 4 may more particularly act as a floating grid and modify the threshold voltage of the rear transistor 30, which it may therefore trigger at the wrong time.

The precise location of the silicon islets 16 depends on the implantation dose of oxygen ions, since the low implantation does, lower than $1.4 \cdot 10^{18}$ ions/cm$^2$, the islets 16 are inside the oxide layer 4, as shown in FIG. 2 of the Stoemenos article in Appl. Phys. Lett cited hereinbefore.

In the case of does of between 1.4 and $1.6 \cdot 10^{18}$ ions/cm$^2$, the presence of the silicon islets is limited to the front 8 and rear 10 Si/SiO$_2$ interfaces (FIG. 1), as shown in FIG. 5 of Bruel's article.

Lastly, for higher doses, above $1.6 \cdot 10^{18}$ ions/cm$^2$, the presence of these silicon islets is observed solely adjacent the rear interface 10, as disclosed in the Article by Stoemenos published in the Journal of Crystal Growth. This latter configuration is shown in FIGS. 1 and 2.

The formation of these silicon islets, also known as silicon precipitates, was explained in Bruel's article; it results from the development after high temperature annealing (approximately 1300° C.) of non-abrupt Si/-SiO$_2$ interfaces of lamellar structure. The formation of these islets is inevitable.

Since the coefficient of diffusion of the silicon through the silicon oxide is extremely low (of the order of $10^{-29}$/cm$^2$ at 400° C.), the Inventors have found that the only way to eliminate the silicon precipitates from the oxide layer was to oxidize them. The processing according to the invention allows such oxidation of the silicon precipitates.

The Inventors also show in an article "Self-interstitial migration in Si implanted with oxygen" published in Physica Scripta, vol. 35, 42–44, 1987, that the formation of the buried layer of silicon dioxide 4 (FIG. 1) brings into play in the direction of the surface 14 of the structure an important flux of silicon atoms displaced from their positions in the crystal and therefore being in an interstitial position.

During implantation, the silicon dioxide precipitates forming in the monocrystalline film 6 block the "migration" towards the surface 14 of the interstitial silicon atoms, which therefore tend to become condensed in the form of dislocation loops in either side of the buried oxide layer. The number of dislocation loops increases with the dose of oxygen ions implanted. After annealing at high temperature, it is the dislocation loops which cause the formation of the traversing dislocations 12 in the semiconductor film.

In addition to eliminating the silicon precipitates present in the silicon dioxide layer, the process according to the invention allows a reduction in the density of the dislocations, more particularly the traversing dislocations, present in the silicon film surrounding the silicon dioxide layer.

Although not much is known about the phenomena of defect formation in the monocrystalline silicon film and the obtaining of a buried insulating layer, resulting from the implantation of N$^+$ ions in a silicon substrate in order to form a buried layer of silicon nitride, the invention is also applied to the obtaining of a buried nitride layer and allows an improvement in the crystalline properties of such nitride layer and in the monocrystalline film surrounding such layer.

The invention therefore relates to a process for the production of a continuous layer of insulating material buried in a semiconductor substrate, characterized in that a number of successive ionic implantation of oxygen or nitrogen are formed in the substrate, with the same energy and doses lower than $1.5 \cdot 10^{18}$ ions O$^+$/cm$^2$, each implantation being followed by an annealing of the substrate at a temperature higher than 800° C., but lower than the melting temperature of the substrate, so as to form a buried insulating layer of oxygen or nitride respectively.

The process on the one hand allows a considerable reduction in the level of dislocation of the semiconductor film formed above the buried insulating layer, while at the same time eliminating the presence of precipitates of semiconductor materials observed in the buried insulating layer by the oxidation or nitridation of such precipitates, in dependence on whether oxygen or nitrogen ions are implanted.

According to the invention the implantation of oxygen or nitrogen ions is performed in a number of stages. The dose of ions implanted in each ionic implantation is lower than the total dose of ions to be implanted. Moreover, the number of implantations is a function of the total dose of ions to be implanted and of the dose of ions implanted in each implantation.

The total dose of ions depends on the thicknesses of the insulating layer and of the monocrystalline film surmounting such insulating layer which is to be obtained. For a given implantation energy, the thickness of the layer of insulator increases with the number of dose of implantation and conversely, the thickness of the monocrystalline film surmounting the layer of insulator decreases with the number and dose of implantation.

By way of example, for a number of implantations of oxygen ions with an energy of 200 keV in silicon, the total dose of implanted ions must be lower than $3.8 \cdot 10^{18}$ ions O$^+$/cm$^2$; above that value there is no silicon film and the insulating layer is no longer buried.

The number of implantations and the dose of ions implanted in each implantation also depends on the nature of the ions and the nature of the substrate in which the ions are implanted.

In the case of the implantation of O$^+$ ions in a silicon substrate, the number of implantations can, for example, vary between 2 and 10, and the dose of ions implanted in each implantation can vary between $10^{16}$ and $0.9 \cdot 10^{18}$ ions O$^+$/cm$^2$. More particularly, in the case of a buried silicon dioxide layer 330 and 400 nm in thickness respectively for a monocrystalline silicon film of 260 and 200 nm respectively, use can be made respectively of 5 and 6 oxygen ion implantations with doses of $3 \cdot 10^{17}$ ions O$^+$/cm$^2$, corresponding to a monoimplantation of 1.5 and $1.8 \cdot 10^{18}$ ions/cm$^2$ respectively.

The implantation energies, which are identical from one implantation to another, are a function of the depth of penetration of the ions; the more the energy increases, the more the penetration depth increases. The energies, for example, are between 100 and 1000 keV.

According to the invention, for example, oxygen or nitrogen ions can be implanted in a monocrystalline silicon substrate.

For a silicon substrate, the implantation of oxygen ions leads to the obtaining of a buried $SiO_2$ layer, while nitrogen ionic implantation results in the formation of a buried silicon nitride layer of formula $Si_3N_4$.

To perform an in situ annealing of the lattice defects created by ion implantation, in other words to avoid making the seminconductor film amorphous and to improve its quality, advantageously the substrate is heated during implantation. For a silicon substrate such heating varies between 500° and 700° C.

The temperature of annealing following each ion implantation depends on the nature of the semiconductor substrate. Moreover, the higher the annealing temperature, the shorter will be the duration of such annealing. For a silicon substrate the annealing temperature is higher than 1100° C. and may range between 1150° and 1400° C. and advantageously between 1300° and 1400° C.; the melting temperature of silicon is 1415° 1 C.

The process according to the invention enables semiconductor structures to be obtained comprising an insulating layer interposed between a semiconductor substrate and a semiconductor film and obtained by the ionic implantation of oxygen or nitrogen in the substrate, characterized in that the semiconductor film has a level of dislocations less than $10^5$ per $cm^2$, and the insulating layer is homogeneous.

The value $10^5$ per $cm^2$ is due to the limit of detection by present-day planar electronic microscopy.

Figure 4A:
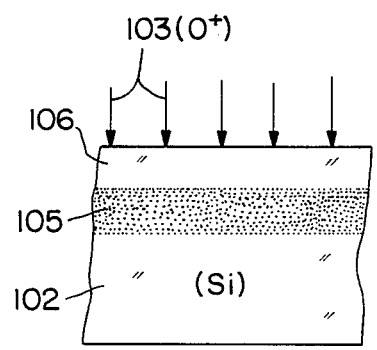
Figure 4B:
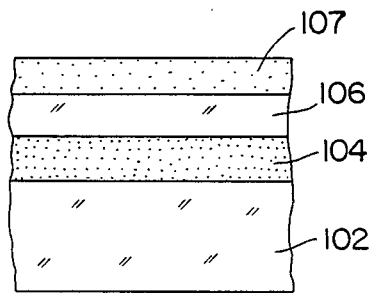
Figure 4C:
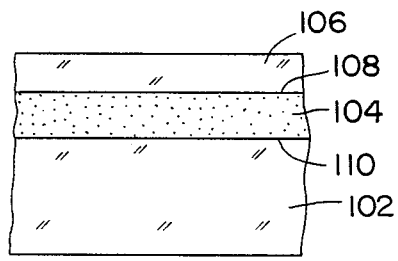

Other features and advantages of the invention will be gathered from the following illustrative, non-limitative description. The description refers to the accompanying drawings, wherein:

FIG. 1 already described, shows diagrammatically in longitudinal section a prior art structure obtained by the SIMOX process, FIG. 2 is a microscopy photograph by electronic transmission on edge of a prior art structure obtained by implanting oxygen ions in monocrystalline silicon, FIG. 3, already described, shows diagrammatically an MOS transistor produced in a silicon layer surmounting a layer of silicon dioxide, FIG. 4 illustrates the process of producing a buried silicon dioxide layer, and FIG. 5 is a microscopy photograph by electronic transmission on edge of the structure obtained by the process according to the invention.

In an example of an embodiment of the process according to the invention, illustrated in FIG. 4, a first implantation of O+ ions 103 is performed with a dose of $0.8 \cdot 10^{18}$ ions/$cm^2$ and an energy of 200 keV in a monocrystalline silicon substrate 102. An implanted oxygen layer 105 is obtained surmounted by a monocrystalline silicon film 106, as indicated in part (a) of FIG. 4. Heating the substrate to a temperature of the order of 600° C. during the implantation more particularly forms an annealing stage enabling the crystalline quality of the semiconductor film 106 to be improved.

Then a plasma-assisted chemical deposit in the vapour phase is preformed of an encapsulating silicon dioxide layer 600 nm in thickness, as illustrated in part (b) of FIG. 4, ensuring protection of the silicon film 106 during the high temperature annealing. The annealing is performed at 1320° C. for 6 hours.

According to the invention the first ion implantation followed by the first high temperature annealing (higher than 1100° C.) leads to a buried silicon dioxide layer 104 containing very numerous precipitates or islets of silicon localized inside the silicon dioxide layer, as illustrated in the article by Stoemenos in Appl. Phys. Lett. cited hereinbefore.

Then the encapsulating layer is eliminated by a chemical engraving with an attack bath comprising FH and $FNH_4$.

Then a fresh oxygen ion implantation is performed with a dose of $0.8 \cdot 10^{18}$ ions/$cm^2$ and an energy of 200 keV. An encapsulating layer 107 is again deposited by plasma-assisted chemical deposit in the vapour phase, whereafter annealing is again performed at 1320° C. for 6 hours.

The second implantation followed by annealing contributes the oxygen necessary for the oxidation of the silicon precipitates present in the buried dioxide layer 104, thus leading to abrupt front 108 and rear 10 Si/$SiO_2$ interfaces.

After the elimination of the second encapsulating layer, a semiconductor structure as shown in part (c) of FIG. 4 is obtained.

The two successive implantations lead to a total implanted dose of $1.6 \cdot 10^{18}$ ions/$cm^2$.

This method of operation leads to the obtaining of a silicon dioxide layer 104 having a thickness of 380 nm and a semiconductor film 106 of the order of 170 nm in thickness.

The structure obtained in these conditions is shown in the photograph reproduced in FIG. 5. It can clearly be seen from the photograph, which was produced by X-microscopy by electronic transmission on edge that the silicon film 106 surmounting the buried silicon dioxide layer 104 is free from traversing dislocations. A characterization by electronic transmission on edge showed that the density of dislocations in the silicon film is less than $10^5$ per $cm^2$. Moreover, the dioxide layer 104 is free from silicon islets and the front 108 and rear 110 Si/$SiO_2$ interfaces are abrupt. This is very important for the industrial production of integrated circuits or wave guides having outstanding electric and optical properties respectively.

The process according to the invention enables silicon-on-insulator structures of outstanding quality to be produced. It enables SIMOX structures to be produced which contain a very small quantity of dislocations, less than $10^5/cm^2$ and comprising a buried silicon dioxide layer free from Si islets and completely homogeneous.

The process according to the invention does not question the industrial nature of the production of SIMOX structures, but on the other hand enables the quality of the layer of monocrystalline silicon to be improved, thus making this kind of material more compatible with industrial requirements.

Apart from the production of integrated circuits in silicon-on-insulator technology, the process according to the invention can be advantageously used for making wave guides in integrated optics on a silicon substrate. The wave guides are formed by one or more layers of $SiO_2$ and or $Si_3N_4$ produced by the ionic implantation of oxygen or nitrogen according to the invention, with different implantation energies, the depth of implantation of the ions increasing with the implantation energy.

The foregoing description is of course merely given by way of illustration, since any modification may be considered without exceeding the scope of the invention. More particularly, an implantation can be performed after covering of the semiconductor substrate with an encapsulating $SiO_2$ layer. The use of such encapsulating layer is more particularly disclosed in the article by Bruel cited hereinbefore.

We claim:

1. A process for producing an oxide continuous layer (104) buried in a silicon monocrystalline substrate (102), consisting essentially of the steps, in sequence:

(A) a first ionic implantation of oxygen in the substrate which is at a temperature from 500° to 700° C. for performing an in situ annealing of the lattice defects created by the first implantation, said first implantation being performed at a predetermined energy and at a dose lower than $1.5 \times 10^{18}$ ions $O^+/cm^2$ whereby to avoid the formation of dislocations in the silicon film provided in the oxide layer;

(B) a first annealing of the structure obtained in step (A) at a temperature higher than 800° C., but lower than the melting temperature of the substrate, whereby to produce said oxide buried layer and precipitates of silicon at the interfaces silicon-oxide;

(C) at least one second ionic implantation of oxygen in the structure obtained in step (B) at said predetermined energy and at a dose lower than $1.5 \times 10^{18}$ ions $O^+/cm^2$, said second implantation being performed while the substrate is at a temperature from 500° to 700° C. for performing an in situ annealing of the lattice defects created by said second implantation; and,.

(D) at least one second annealing of the structure obtained in step (C) at a temperature higher than 800° C., but lower than the melting temperature of the substrate, so as to oxidize said precipitates of silicon.

2. A process according to claim 1, characterized in that the number of implantations and the dose of implanted ions depend on the total dose of ions which is to be implanted.

3. A process according to claim 1, characterized in that the annealings are performed at a temperature higher than 1100° C.

4. A process according to claim 1, characterized in that the annealings are performed at a temperature between 1300° and 1400° C.

5. A semiconductor structure comprising an insulating layer (104) interposed between a semiconductor substrate (102) and a semiconductor film (106) and obtained by the process according to claim 1, characterized in that the semiconductor film (106) has a level of dislocations less than $10^5$ per $cm^2$, and the insulating layer (104) is homogeneous.

6. A process according to claim 1, characterized in that the number of implantations is 2, each implantation being performed at $0.8 \cdot 10^{18}$ ions/$cm^2$.

7. A process for producing an oxide continuous layer (104) buried in a silicon monocrystalline substrate (102), consisting essentially of the steps in sequence:

(A) a first ionic implantation of oxygen in the substrate which is at a temperature from 500° to 700° C. for performing an in situ annealing of the lattice defects created by the first implantation, said first implantation being performed at a predetermined energy and at a dose lower than $1.5 \times 10^{18}$ ions $O^+/cm^2$ whereby to avoid the formation of dislocations in the silicon film provided in the oxide layer;

(B) a first encapsulation of the structure obtained in step (A), (C) a first annealing of the structure obtained in step (B) at a temperature higher than 800° C., but lower than the melting temperature of the substrate, whereby to produce said oxide buried layer and precipitates of silicon at the interfaces silicon-oxide;

(D) eliminating the first encapsulation;

(E) at least one second ionic implantation of oxygen in the structure obtained in step (D) at said predetermined energy and at a dose lower than $1.5 \times 10^{18}$ ions $O^+/cm^2$, said second implantation being performed while the substrate is at a temperature from 500° to 700° C. for performing an in situ annealing of the lattice defects created by said second implantation;

(F) at least second encapsulation of the structure obtained in step (E); and (G) at least one second annealing of the structure obtained in step (F) at a temperature higher than 800° C., but lower than the melting temperature of the substrate, so as to oxidize said precipitates of silicon.

8. A process according to claim 7, characterized in that the number of implantations and the dose of implanted ions depend on the total dose of ions which is to be implanted.

9. A process according to claim 7, characterized in that the annealings are performed at a temperature higher than 1100° C.

10. A process according to claim 7, characterized in that the annealings are performed at a temperature between 1300° and 1400° C.

11. A semiconductor structure comprising an insulating layer (104) interposed between a semiconductor substrate (102) and a semiconductor film (106) and obtained by the process according to claim 7, characterized in that the semiconductor film (106) has a level of dislocations less than $10^5$ per $cm^2$, and the insulating layer (104) is homogeneous.

12. A process according to claim 7, characterized in that the number of implantations is 2, each implantation being performed at $0.8 \cdot 10^{18}$ ions/$cm^2$.

* * * * *